(12) United States Patent
Yang et al.

(10) Patent No.: US 7,782,232 B2
(45) Date of Patent: Aug. 24, 2010

(54) ENCODING AND DECODING METHODS USING GENERALIZED CONCATENATED CODES (GCC)

(75) Inventors: Xueshi Yang, Sunnyvale, CA (US); Gregory Burd, San Jose, CA (US); Heng Tang, Sunnyvale, CA (US); Panu Chaichanavong, Mountain View, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 56 days.

(21) Appl. No.: 12/187,160

(22) Filed: Aug. 6, 2008

(65) Prior Publication Data

US 2009/0040081 A1   Feb. 12, 2009

Related U.S. Application Data

(60) Provisional application No. 60/954,658, filed on Aug. 8, 2007.

(51) Int. Cl.
   *H03M 13/00* (2006.01)
(52) U.S. Cl. ........................................ 341/94; 714/755
(58) Field of Classification Search ................... 341/94; 714/755

See application file for complete search history.

(56) References Cited

U.S. PATENT DOCUMENTS 6,678,856 B1 * 1/2004 Jordan et al. ................. 714/755

7,484,165 B2 * 1/2009 Griesser et al. ............ 714/782
2007/0171714 A1  7/2007 Wu et al.

OTHER PUBLICATIONS

Blokh E L et al: "Coding of Generalized Concatenated Codes" Problems of Information Transmission, Jul. 1, 1974, pp. 218-222, XP008034896, vol. 10, No. 3, New York, NY, US.

Henkel W: "Phase-Invariant Code Phase Shift Keying Using Reed-Muller Codes", Archiv Fur Elektronik Unk Ubertragungstechnik, S. Hirzel Verlag, May 3, 1992, pp. 125-130, XP000304721, vol. 46, No. 3, Stuttgart, DE.

Detmar U et al: "Modified Generalized Concatenated Codes and their Application to the Construction and Decoding of LUEP Codes", Sep. 5, 1995, pp. 1499-1503, XP000542640, vol. 41, No. 5, IEEE Transactions on Information Theory, IEEE, US.

Blokh, V., Zyablov, V., "Coding of Generalized Concatenated Codes", Problems of Information Transmission, vol. 10, 1974, pp. 218-222.

Zinoviev, V.A., "Generalized Cascade Codes", Problems of Information Transmission, vol. 12-issue 1, 1976, pp. 5-15.

* cited by examiner

*Primary Examiner*—Khai M Nguyen

(57) ABSTRACT

Systems, apparatuses, and methods for encoding and decoding using generalized concatenated codes (GCC) are described. The methods include receiving data; encoding the received data to obtain first encoded data; encoding the first encoded data until a GCC encoding reaches an intermediate level; and terminating the GCC encoding at the intermediate level.

23 Claims, 7 Drawing Sheets

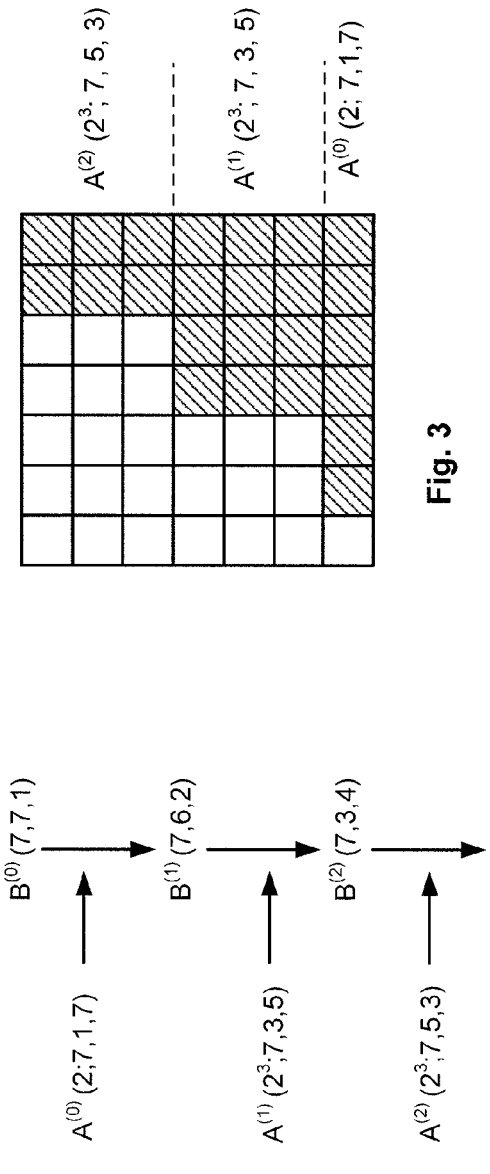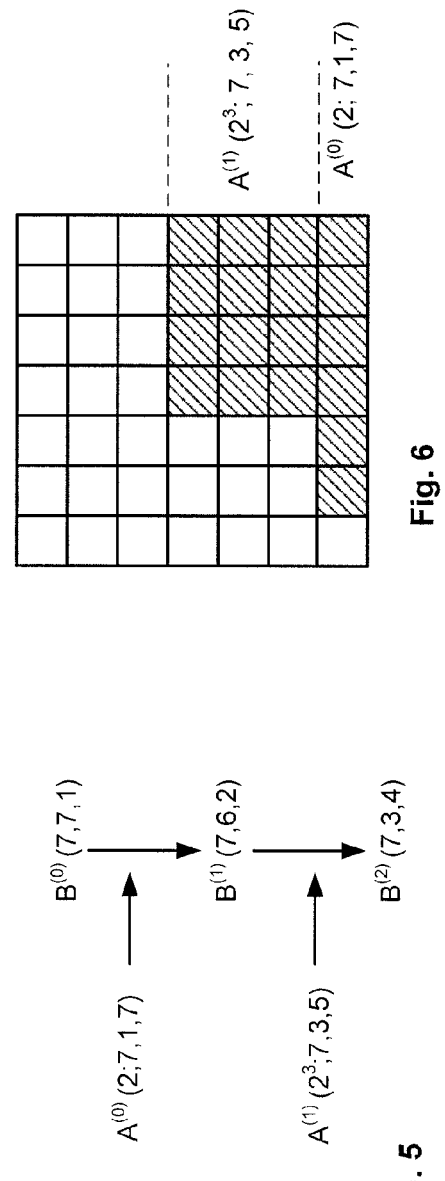

ENCODING AND DECODING METHODS USING GENERALIZED CONCATENATED CODES (GCC)

CROSS REFERENCE TO RELATED APPLICATIONS

The present application claims priority to U.S. application No. 60/954,658, filed Aug. 8, 2007, entitled "Encoding and Decoding Methods for Solid-State Memory Devices," the entire specification of which is hereby incorporated by reference in its entirety for all purposes, except for those sections, if any, that are inconsistent with this specification.

TECHNICAL FIELD

Embodiments of the present invention relate to the field of encoding and decoding, and in particular, to encoding and decoding using generalized concatenation code encoding.

BACKGROUND

Error detection and/or error correction codes are used for detecting and/or correcting errors in a signal. Forward error correction (FEC) is a system of error control for data transmission in which the sender adds redundant data to the transmitted data, which allows the receiver to detect and/or correct errors. The code rate of an FEC code is an indication of the portion of total information that is useful (i.e., non redundant). For example, if the code rate is x/y, for every x bits of useful information, the coder generates a total of y bits of data, of which (y-x) bits are redundant. Although higher redundancy may sometimes help in better error detection and/or correction, it may lower the code rate, thereby limiting the amount of useful information to be transmitted.

There exists several different types of FEC encoding and decoding techniques. Generalized (or multilevel) concatenated code (GCC) is a popular coding technique that is based on partitioning data into a number of subgroups or co-sets, and generating a plurality of inner codes and outer codes. The code class (referred to at the time as "generalized error locating codes" and confined to a linear partitioning scheme) was introduced by Blokh and Zyablov [V. Blokh, V. Zyablov, "Coding of Generalised Concatenated Codes," Problems of Information Transmission, Volume 10 (1974), pp. 218-222] as a generalization of "Error Locating Codes". Later Zinoviev [V. A. Zinoviev, "Generalized cascade codes." Problemy Peredachi Informati, vol. 12, no. 1, pp. 5-15, 1976] found a more general description based on the partitioning of sets.

GCC is used for encoding data using a plurality of outer codes and inner codes, as will be explained in further detail later. GCC encoding involves partitioning of a code word of a finite length into different subgroups or co-sets, and partitioning each subgroup into further subgroups, and continuing the process until each subgroup or co-set includes only one single codeword. Before discussing various aspects of the GCC code, mathematical expression of the coding technique may be discussed. A plurality of linear codes are called "disjoint" if the linear codes have no common code word (except the all zero code word), and the dimension of the sum of the codes is given as the sum of the dimension of the addends. If each of a plurality of linear codes includes only one single codeword, then the plurality of linear codes are disjoint. Let $C(p^q; n, k, d)$ denote a linear code block of length n, dimension k, and a minimum hamming distance d over the Galois field $GF(p^q)$. As is well known in the art, for a fixed length m, the hamming distance is a metric on the vector space of the words of that length. Conventional GCC encoding is well known in the art, and a brief overview of GCC encoding will now be presented.

FIG. 1 illustrates a conventional GCC coding technique using an exemplary partition tree. Referring to FIG. 1, in various embodiments, a linear code $B^{(0)}(p^q; n_b, k_b^{(0)}, d_b^{(0)})$ may be partitioned into I number of subgroups or co-sets $B_1^{(1)}, B_2^{(1)}, \ldots, B_I^{(1)}$, such that $B^{(0)} = U_i B_i^{(1)}$. Such a partition may be denoted by $B^{(0)}/B^{(1)}$ and I is the order of partition. The outer label, e.g., $a_1^{(0)}$, denotes the coset $B_1^{(1)}$. The subgroups or co-sets $B_1^{(1)}, B_2^{(1)}, \ldots, B_I^{(1)}$ may collectively be referred as $B^{(1)}$. The number of subgroups or co-sets a code is partitioned into (e.g., in this case, I subgroups), for a given level, may be based at least in part on various factors, including but not limited to the dimension of the original code word, a parity check matrix used for partitioning, complexity involved in the partitioning, a type of GCC encoding used, etc.

Referring to FIG. 1, each of the subgroups $B_1^{(1)}, B_2^{(1)}, \ldots, B_I^{(1)}$ in $B^{(1)}$ may be further partitioned into subgroups (in FIG. 1, only $B_1^{(1)}$ is illustrated as further partitioned for the sake of clarity). This further partitioning may continue (illustrated by dotted lines) until each of the co-sets of the highest (i.e., the last) level (which is L in FIG. 1) includes only a single code word. Thus, in FIG. 1, the partitioning may continue until obtaining disjoint codes $B_1^{(L)}, B_2^{(L)}, \ldots$, each including only one single code word, and resulting in an L-level partition chain $B^{(1)}/B^{(2)}/\ldots/B^{(L)}$. A particular coset in the partition tree can be represented by a vector consists of coset labels along the partition branches starting from the tree root $B(0)$. For example, the vector $\{a_1^{(0)}, a_1^{(1)}, \ldots, a_1^{(L-1)}\}$ represents the coset $B_1^{(L)}$.

It should be noted that while only some of the intermediate co-sets are illustrated as being partitioned, all co-sets of all the intermediate level (i.e., $1, \ldots, (L-1)$ levels) inner codes are partitioned. Accordingly, the inner code $B^{(L)}$ not only includes co-sets $B_1^{(L)}, B_2^{(L)}, \ldots, B_j^{(L)}$ from partitioning $B_1^{(L-1)}$ as illustrated, but also includes co-sets obtained from partitioning other co-sets of $(L-1)$ level.

An L-level GCC code C consists of L outer codes $A^{(l)}(q^{m_a^{(l)}}:n_a, k_a^{(l)}, d_a^{(l)})$ and an inner code $B^{(1)}(q:n_b, k_b^{(1)}, d_b^{(1)})$ that is partitioned into an L-level partition chain $B^{(1)}/B^{(2)}/\ldots/B^{(L+1)}$. The subcodes of level L+1 consist of a single codeword only. The symbol $a_i^{(l)}$ of the l-th outer code determines a subset of $B^{(l)}_{a_i^{(1)}, a_i^{(2)}, \ldots, a_i^{(l-1)}}$. Thus the symbols $a_i^{(l)}$ of all outer codes together form the label $(a_i^{(1)}, \ldots, a_i^{(L)})$ of a unique codeword $b_i$. The codeword of the GCC code consists of all the codewords $b_i, i=1, \ldots, n_a$.

The outer code can be related to the parity check matrix as follows. Let $H_{B(L)}$ be a parity check matrix of the inner code $B^{(l)}$ and $\overline{a}^{(l)}$ a codeword of the l-th outer code $A^{(l)}$, each codeword C of a GCC code in matrix form fulfills $$\overline{a}^{(l)} = H_{B^{(l)}/B^{(l+1)}} \cdot C \text{ for all } l=0, \ldots, L-1.$$

In the above equation, notations are defined as $$H_{B^{(2)}} = \begin{bmatrix} H_{B^{(1)}/B^{(2)}} \\ H_{B^{(1)}} \end{bmatrix}, \ldots \text{ and } H_{B^{(L)}} = \begin{bmatrix} H_{B^{(L-1)}/B^{(L)}} \\ \vdots \\ H_{B^{(1)}/B^{(2)}} \\ H_{B^{(1)}} \end{bmatrix}.$$

FIG. 2 illustrates an exemplary partition tree of a 3-level GCC code. Referring to FIG. 2, GCC coding may be used to partition the original code word $B^{(0)}(7,7,1)$. The 3-level GCC code may be constructed using inner codes $B^{(0)}(7,7,1)/B^{(1)}$ (7,6,2)/$B^{(2)}$(7,3,4)/$B^{(3)}$(7,0,∞) and outer codes $A^{(0)}$(2; 7,1,7), $A^{(1)}$($2^3$; 7,3,5), and $A^{(2)}$($2^3$; 7,5,3). The dimension of the inner codes decreases with the increase in its level, and the $3^{rd}$ level code word $B^{(3)}$ includes only one single code word (i.e., of dimension 0). The hamming distances of the inner codes increases with an increase in the code level. For example, the $1^{st}$, $2^{nd}$, and $3^{rd}$ level inner codes have a hamming distance of 2, 4, and infinity (each co-set of the $3^{rd}$ level includes only one single, unique code word, resulting in an infinite hamming distance), respectively.

As will be readily appreciated by those skilled in the art, GCC introduces redundancies in the form of outer codes $A^{(0)}$, $A^{(1)}$, $A^{(2)}$, ..., $A^{(L-1)}$ and/or the inner codes $B^{(0)}$. FIG. 3 illustrates an exemplary encoded data structure corresponding to the GCC partition tree of FIG. 2. The shaded portion of FIG. 3 corresponds to the redundancy bits for the outer codes $A^{(0)}$, $A^{(1)}$, $A^{(2)}$, while the white area may contain user information bits. As seen in FIG. 3, a large portion of the encoded data includes redundant bits generated by codes $A^{(0)}$, $A^{(1)}$, $A^{(2)}$. Although the higher redundancy may increase the correct power of the code, it may reduce the code rate.

SUMMARY

In various embodiments, the present invention provides encoding and decoding methods using generalized concatenated codes (GCC). More specifically, there is provided, in accordance with various embodiments of the present invention, a method for receiving data, encoding the received data to obtain first encoded data, encoding the first encoded data until a generalized concatenation code (GCC) encoding reaches an intermediate level, and terminating the encoding of the first encoded data at the intermediate level of the GCC encoding to provide GCC encoded data. The method may further include terminating the encoding at the intermediate level of the GCC encoding such that each of a plurality of co-sets of the intermediate level includes multiple code words.

In various embodiments, the method may also include repeatedly partitioning an inner code until reaching the intermediate level and forming a plurality of outer codes and a plurality of inner codes. The method may include terminating the encoding of the first encoded data at the intermediate level such that a hamming distance of an inner code of the intermediate level is finite. In various embodiments, the method may include segmenting the first encoded data into a plurality of segments. In various embodiments, the encoding the first encoded data further comprises separately encoding each of the plurality of segments of the first encoded data using the GCC encoding to obtain a plurality of second encoded data. The method may include separately encoding each of the plurality of segments either in parallel or serially. The method may include multiplexing the plurality of second encoded data, and transmitting the multiplexed plurality of second encoded data.

In various embodiments, the encoding of the received data further comprises encoding the received data using an algebraic code, a Reed-Solomon (RS) code or a Bose-Chaudhuri-Hocquenghem (BCH) code. The method may further comprise storing the second encoded data in a flash memory device. The method may further comprise transmitting the GCC encoded data. In various embodiments, the method may also include receiving the transmitted GCC encoded data, decoding the transmitted GCC encoded data to generate a first decoded data, and decoding the first decoded data using an outer-layer code.

There is also provided, in accordance with various embodiments of the present invention, an apparatus comprising an outer-layer code encoder configured to receive data and encode the received data into first encoded data, and at least one generalized concatenation code (GCC) encoder configured to encode the first encoded data. The GCC encoder may be further configured to encode the first encoded data using GCC encoding, and to terminate the GCC encoding at an intermediate level. The GCC encoder may be further configured to terminate the GCC encoding at the intermediate level such that each of a plurality of co-sets of the intermediate level includes multiple code words. The GCC encoder may be configured to repeatedly partition the first encoded data until reaching the intermediate level. In various embodiments, the apparatus may also include a segmenter to segment the first encoded data into a plurality of segments; and a plurality of GCC encoders, each GCC encoder configured to encode a respective segment of the first encoded data. The apparatus may also include a multiplexer configured to receive and multiplex outputs from the plurality of GCC encoders. The apparatus may also include at least one GCC decoder configured to decode the output of the at least one GCC encoder; and an outer-layer code decoder configured to decode the output of the at least one GCC decoder. In various embodiments, the outer-layer code encoder may be a Reed-Solomon (RS) encoder or a Bose-Chaudhuri-Hocquenghem (BCH) encoder.

There is also provided, in accordance with various embodiments of the present invention, an apparatus that includes means for receiving data, means for encoding the received data to obtain first encoded data, means for encoding the first encoded data until a generalized concatenation code (GCC) encoding reaches an intermediate level, and means for terminating the GCC encoding at the intermediate level. The GCC encoding may be terminated at the intermediate level such that each of a plurality of co-sets of the intermediate level includes multiple code words. The means for encoding using the GCC encoder may further comprises means for forming a plurality of outer codes and a plurality of inner codes.

The present invention also provides a method for receiving data, encoding the first received data until a generalized concatenation code (GCC) encoding reaches an intermediate level, and terminating the encoding of the received data at the intermediate level of the GCC encoding to provide GCC encoded data. The method may further include terminating the encoding at the intermediate level of the GCC encoding such that each of a plurality of co-sets of the intermediate level includes multiple code words. The method may also include further encoding of the GCC encoded data, The present invention also provides an apparatus that includes means for receiving data, means for encoding the received data until a generalized concatenation code (GCC) encoding reaches an intermediate level to provide GCC encoded data, and means for terminating the GCC encoding at the intermediate level. The apparatus may also include means for further encoding of the GCC encoded data, Other features that are considered as characteristic for embodiments of the present invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 2 illustrates an exemplary partition tree of a 3-level GCC code;

FIG. 3 illustrates an exemplary encoded data structure corresponding to the GCC partition tree of FIG. 2;

FIG. 5 illustrates an exemplary partition tree of a GCC code, in accordance with various embodiments of the present invention;

FIG. 6 illustrates an exemplary data structure including the redundancy portion of a GCC code corresponding to the GCC partition tree of FIG. 5, in accordance with various embodiments of the present invention;

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Figure 1:
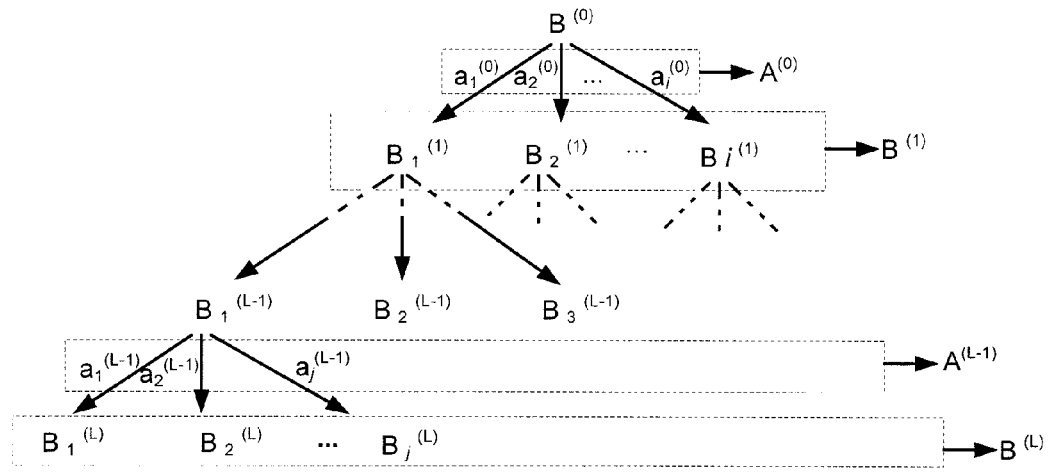
FIG. 1 illustrates a conventional GCC coding technique using an exemplary portion tree.
Figure 4:
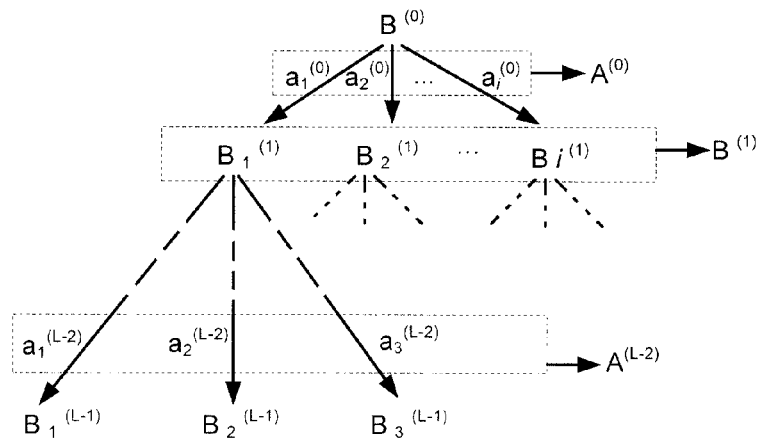
FIG. 4 illustrates a GCC encoding, in accordance with various embodiments of the present invention.

FIG. 4 illustrates a GCC encoding approach, in accordance with various embodiments of the present invention. The original code $B^{(0)}$ and the subsequent inner codes $B^{(1)}, B^{(2)}, \ldots, B^{(L-1)}$ and the outer codes $A^{(0)}, A^{(1)}, A^{(2)}, \ldots, A^{(L-2)}$ of FIG. 4 may be substantially similar to that of FIG. 1. However, in the GCC encoding of FIG. 4, the partitioning may be terminated before the $L^{th}$ level (e.g., the illustrated GCC encoding is terminated at $(L-1)^{th}$ level). That is, unlike conventional GCC encoding of FIGS. 1-3 (where partitioning is continued until each co-set of the last or the highest level contains only a single codeword), in the GCC encoding of FIG. 4, the partitioning may be stopped at an intermediate level in which each co-set may contain multiple code words. Accordingly, the number of outer codes may also be reduced. For example, the GCC encoding of FIG. 4 includes (L−1) outer codes ($A^{(0)}, A^{(1)}, A^{(2)}, \ldots, A^{(L-2)}$), as opposed to L outer codes in the conventional GCC of FIG. 1. As will be readily apparent to those skilled in the art, although FIG. 4 illustrates terminating the GCC at $(L-1)^{th}$ level, in various embodiments, the GCC may optionally be terminated at an earlier level (e.g., $1^{st}$, $2^{nd}, \ldots,$ or $(L-2)^{th}$ level).

FIG. 5 illustrates an exemplary partition tree of a GCC code, in accordance with various embodiments of the present invention. The original code word $B^{(0)}$ may have a length, dimensions, and a hamming distance similar to that of FIG. 2. Referring to FIG. 5, the 2-level GCC may partition $B^{(0)}$ into inner code partition chain of $B^{(0)}(7,7,1)/B^{(1)}(7,6,2)/B^{(2)}(7,3,4)$. That is, unlike the conventional GCC encoding of FIG. 2, the GCC encoding of FIG. 5 may be terminated at level 2 (i.e., at $B^{(2)}(7,3,4)$). Thus, as previously discussed, each co-set of the last level ($B^{(2)}$) of the GCC encoding of FIG. 5 may include multiple code words. For example, each co-set of the $2^{nd}$ level inner codes has code words of dimension 3. The GCC of FIG. 5 may include only $A^{(0)}$ and $A^{(1)}$ as the outer codes. That is, unlike conventional GCC encoding of FIG. 2, the GCC encoding of FIG. 5 may not include outer code $A^{(2)}$. Additionally, the hamming distance of the co-sets of the last level of the GCC encoding of FIG. 5 may be finite (e.g., hamming distance of 4), which is less than the hamming distance of infinity for the last level of co-sets in a conventional GCC.

FIG. 6 illustrates an exemplary data structure including the redundancy portion of a GCC code corresponding to the GCC partition tree of FIG. 5, in accordance with various embodiments of the present invention. Similar to FIG. 3, the shaded portion of FIG. 6 corresponds to the redundancy bits of the outer codes, while the white area may contain user information bits. As illustrated in FIG. 5, the GCC may include outer codes $A^{(0)}$ and $A^{(1)}$ only, illustrated by shaded areas in FIG. 6. As may be seen in FIGS. 3 and 6, the GCC encoding of FIG. 6 may result in less redundancy (i.e., less shaded area) as compared to the conventional GCC encoding of FIG. 3, thereby resulting in a higher code rate. However, with the reduction in redundancy, the correction power of the GCC encoding may also decrease, and may be less than that of the conventional GCC.

Figure 7:
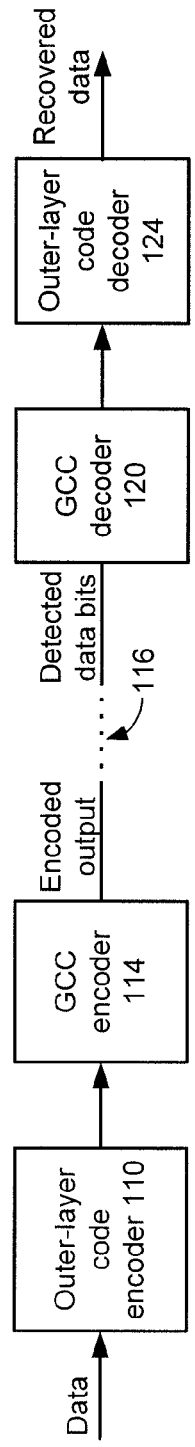
FIG. 7 illustrates an exemplary block diagram of an encoder and a decoder, in accordance with various embodiments of the present invention.

To increase the correction power of the GCC encoding previously discussed, in accordance with various embodiments of the present invention, another layer of concatenated code may be utilized along with GCC encoding. FIG. 7 illustrates an exemplary block diagram of an encoder and a decoder, in accordance with various embodiments of the present invention. In various embodiments, the encoder-decoder structure may include an outer-layer code encoder 110 configured to receive data. The output of the outer-layer code encoder 110 may be input to a GCC encoder 114, which may output the encoded data. In various embodiments, the GCC encoder 114 may be configured to implement a GCC coding, by partitioning the received code word into various subgroups, and continue partitioning the subgroups, but stop or terminate the GCC encoding at an intermediate level where each co-set of the last level includes multiple code words. As previously discussed, such encoding reduces redundancy in the code, but may also result in decreased correction power of the encoding. The outer-layer code encoder 110 may be utilized to supplement the correction power of the GCC encoder 114, without significantly contributing to the redundancy of the GCC coding. In various embodiments, the outer-layer code encoder 110 may encode data, which may be further encoded with the GCC encoder 114. In various embodiments, the outer-layer code may be an appropriate algebraic code of sufficient length, denoted as $N_o$. Assuming the information bit length of the GCC encoder is $K_{gcc}$, $N_o$ can be chosen such that $N_o >= m*K_{gcc}$ where m is an integer and m>=2. Algebraic codes such as Reed-Solomon (RS) code, Bose-Chaudhuri-Hocquenghem (BCH) code, etc. may be used as the outer-layer code. It should be noted that the outer-layer code of FIG. 7 is different from the outer labels or the outer codes of the GCC.

Figure 13:
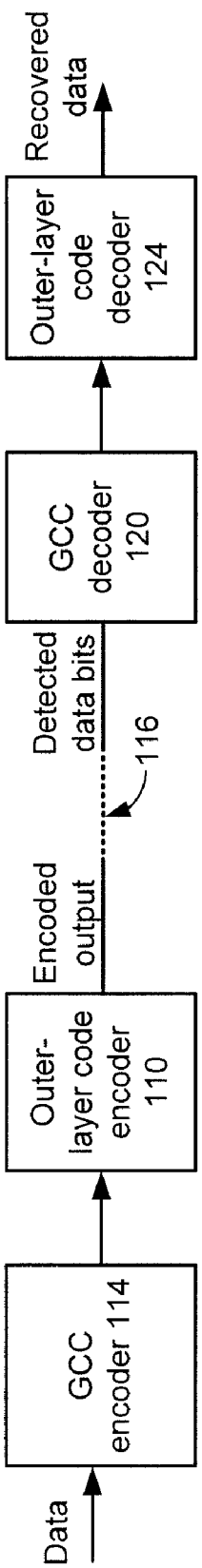
FIG. 13 illustrates an exemplary block diagram of an encoder and a decoder, in accordance with various embodiments of the present invention.

Although the outer-layer code encoder 110 is illustrated in FIG. 7 as receiving data and outputting to the GCC encoder 114, the reverse may also be possible. That is, in various embodiments, the GCC encoder 114 may first receive data, and output to the outer-layer code encoder 110 (i.e., the GCC encoder 114 may appear before the outer-layer code encoder 110), as may be seen in FIG. 13. In those embodiments, the outer-layer code encoder may be referred to as inner-layer code encoder.

In various embodiments, the encoded output 116 (illustrated as dotted line) of the GCC encoder 114 may be transmitted over a channel and/or stored in a storage medium, for example, a memory device (e.g., a flash memory device).

In various embodiments, a GCC decoder 120 and an outer-layer code decoder 124 may be a part of the decoder of the system of FIG. 7. That is, the detected data bits of the encoded data may be first decoded utilizing the GCC decoder 120 and then decoded by the outer-layer code decoder 124. The operation of the GCC decoder 120 would be readily apparent to those skilled in the art from the description of the GCC encoder 114, and hence, would not be discussed in details. Similarly, the operation of the outer-layer code decoder 124 would be readily apparent from the description of the outer-layer code encoder 110.

Figure 8:
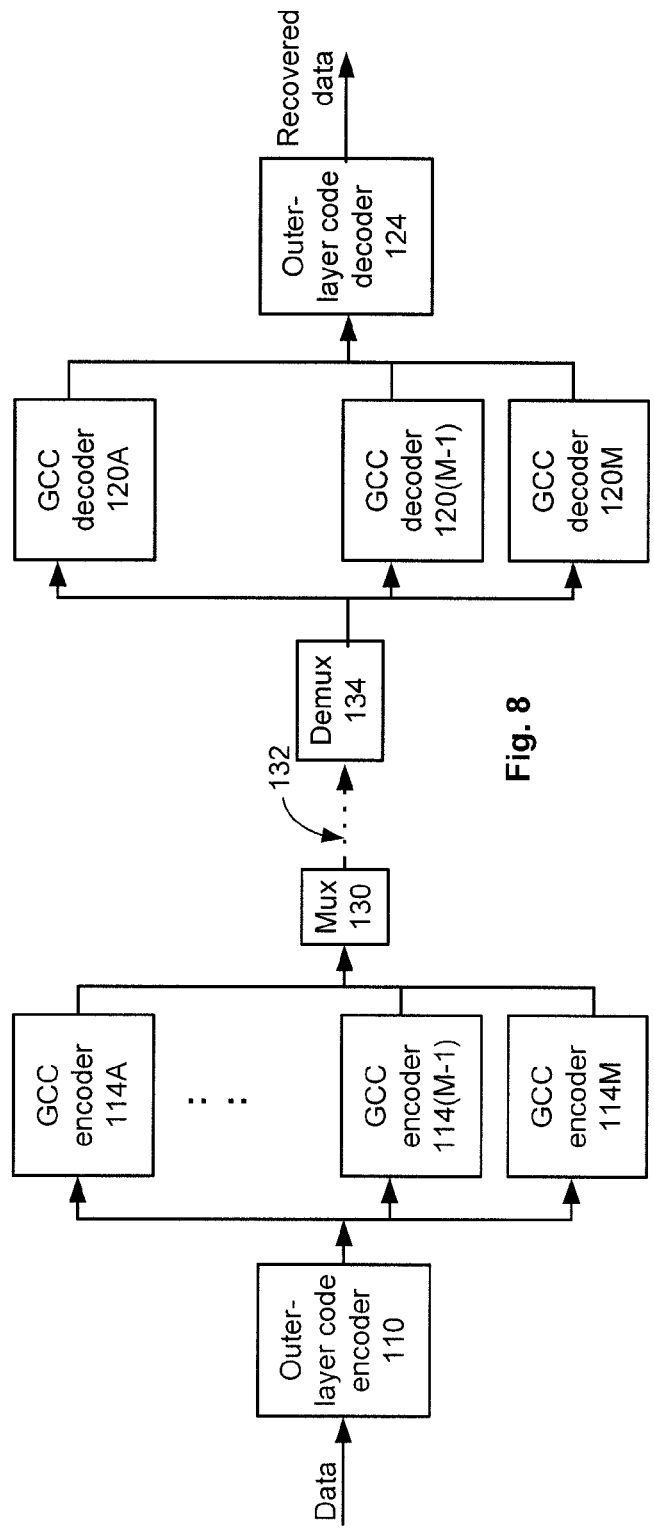
FIG. 8 illustrates another exemplary block diagram of an encoder and a decoder, in accordance with various embodiments of the present invention.

FIG. 8 illustrates another exemplary block diagram of an encoder and a decoder, in accordance with various embodiments of the present invention. Referring to FIG. 8, in various embodiments, the encoder-decoder structure may include an outer-layer code encoder 110 configured to receive data. After the data is encoded by the outer-layer code encoder 110, the encoded data may be divided into M number of segments, each data segment being encoded by a respective GCC encoder 114A, 114M. In various embodiments, segmenting the encoded data (i.e., output of the outer-layer code encoder 110) in M-segments is different from the GCC partitioning. The segmentation of the encoded data may be based at least in part on the size of the received data, the desired speed of encoding, etc. In various embodiments, the segmentation may be performed by a segmenter or a demultiplexor (not illustrated in FIG. 8).

Figure 9:
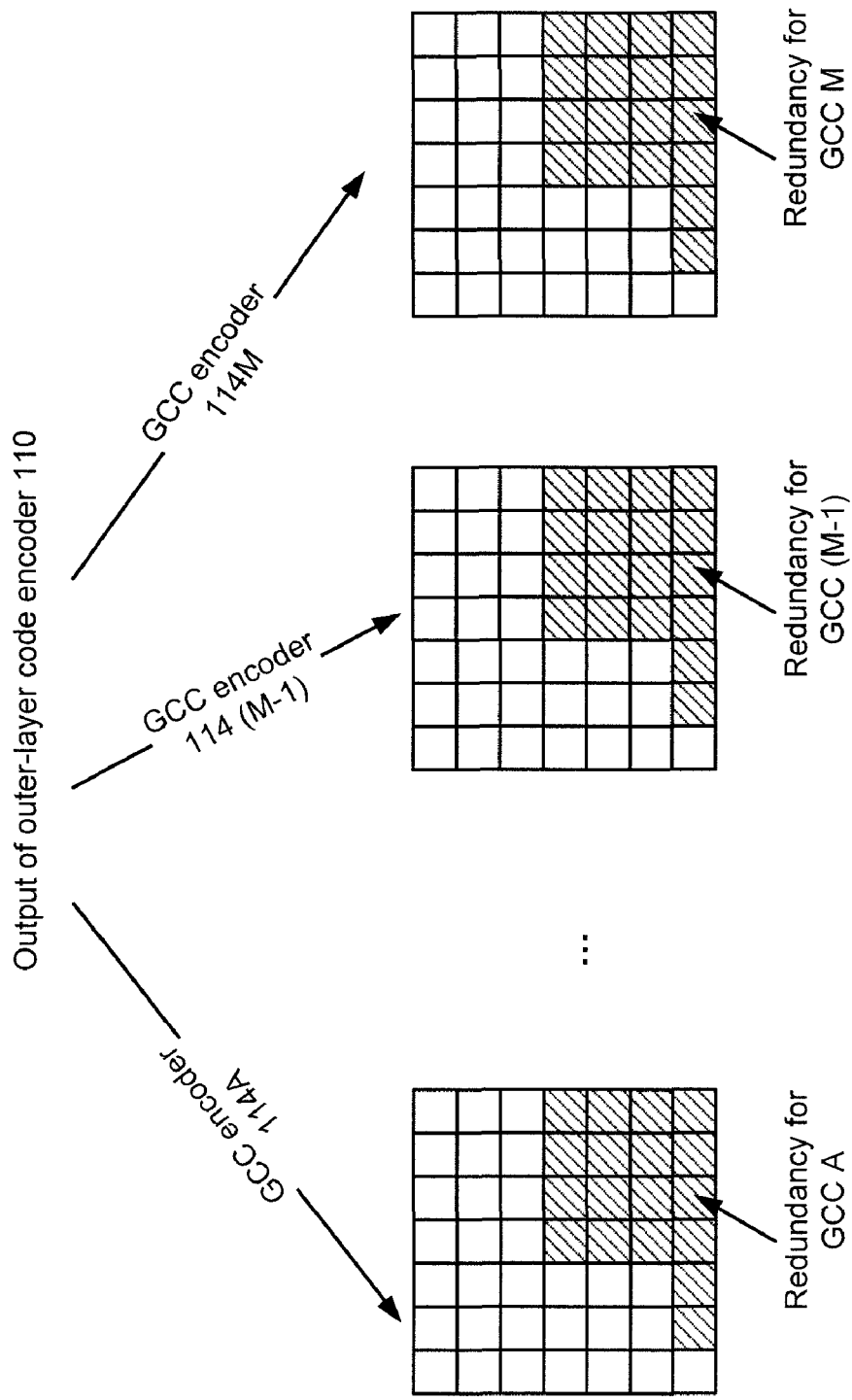
FIG. 9 illustrates an exemplary data structure of an encoded output of a plurality of GCC encoders, in accordance with various embodiments of the present invention.

FIG. 9 illustrates an exemplary data structure of the encoded output of the M GCC encoders 114A, . . . , 114M, in accordance with various embodiments of the present invention. Referring to FIGS. 8 and 9, the output of each of the GCC encoder 114A, . . . , 114M may include redundancy because of inclusion of the inner codes. However, since the GCC encoding of FIGS. 8 and 9 may be terminated at an intermediate level, as previously discussed, redundancy (indicated by the shaded portions in the data structures of FIG. 9) in the output of the GCC encoders 114A, . . . , 114M may be less than that of a conventional GCC. The resultant decrease in error correction power (as a result of reduced redundancy) may be compensated by the outer-layer code encoder 110.

Referring to FIG. 8, the output of the GCC encoders 114A, . . . , 114M may be multiplexed using multiplexor (mux) 130, and the multiplexed output 132 may be transmitted over a channel and/or stored in a storage medium (illustrated by dotted line).

The decoding stage of FIG. 8 may include demultiplexor (demux) 134 to demultiplex detected data bits into M segments, M number of GCC decoder 120A, . . . , 120M to decode respective encoded data segments, and an outer-layer code decoder 124 to recover data.

Figures 10, 11:
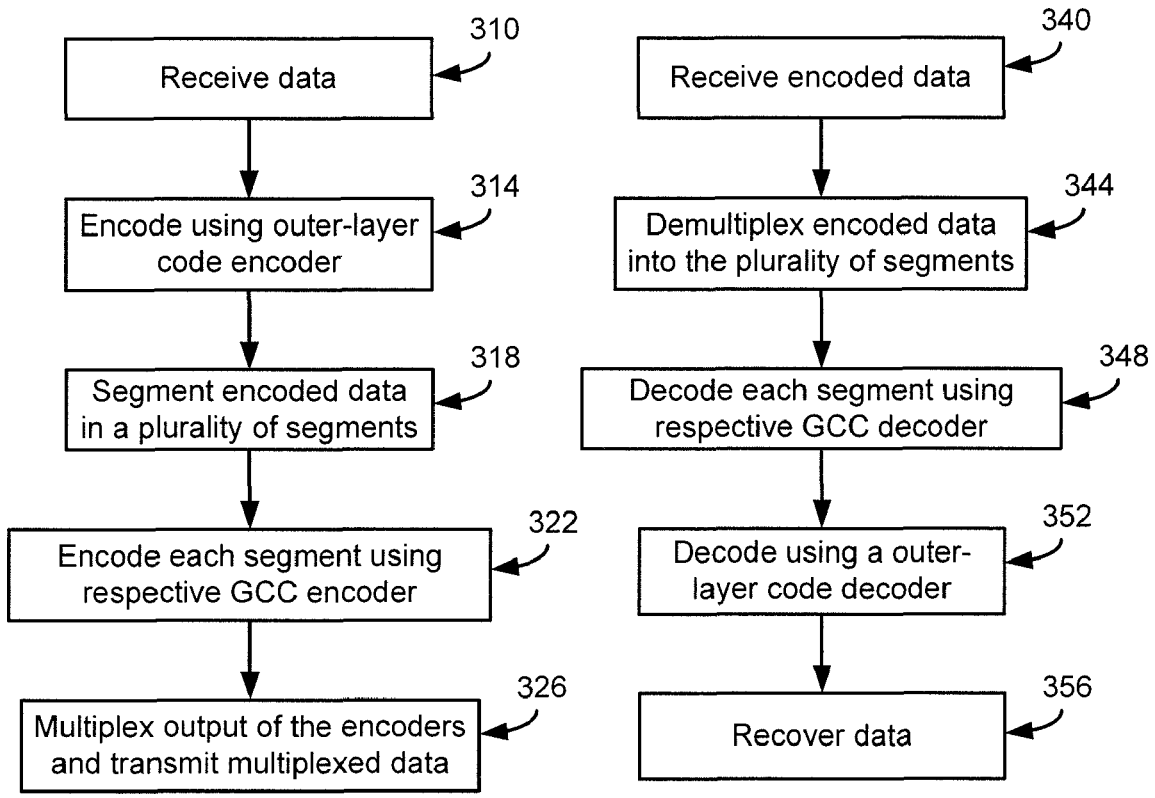
FIG. 10 illustrates an exemplary method of encoding data, in accordance with various embodiments of the present invention.
FIG. 11 illustrates an exemplary method of decoding data, in accordance with various embodiments of the present invention.

FIG. 10 illustrates an exemplary method of encoding data, in accordance with various embodiments of the present invention. Referring to FIGS. 8 and 10, at 310, data may be received, and at 314, encoded using the outer-layer code encoder 110. At 318, the encoded data may be segmented in a plurality of segments (e.g., M number of segments), and at 322, each segment of data may be encoded using respective GCC encoders 114A, . . . , 114M such that the GCC encoding at one or more GCC encoders 114A, . . . , 114M is terminated at an intermediate level. At 326, the encoded output of the M number of GCC encoders may be multiplexed using mux 130 and transmitted over a channel and/or stored in a storage medium, such as a flash memory device.

FIG. 11 illustrates an exemplary method of decoding data, in accordance with various embodiments of the present invention. Referring to FIGS. 8 and 11, at 340, encoded data may be received, which, in various embodiments, may be similar to the multiplexed data at 326 of FIG. 10. At 314, the received encoded data may be demultiplexed, using the demux 134, into the plurality of segments 1, . . . , M. At 348, the demultiplexed segmented data may be decoded using respective GCC decoder 120A, . . . 1120M, and at 352, may be further decoded using the outer-layer code decoder 124 to recover the data at 356.

As will be readily apparent to those skilled in the art, in various embodiments, the methods of FIGS. 10 and 11 may be suitably modified to accommodate the encoder/decoder structure of FIG. 7, where the output of the outer-layer code encoder 110 is inputted into the GCC encoder 114 (i.e., the output of the outer-layer code encoder 110 is not segmented). In such embodiments, the output of the GCC encoder 114 may be transmitted over a channel and/or stored in a storage device without performing the multiplexing operation at 326. Similarly, the received encoded data at 340 may be decoded using the GCC decoder 120 at 348 (without demultiplexing the received data at 344).

In various embodiments, the GCC encoding along with the outer-layer coding in accordance with various embodiments of the present invention may achieve high error correction power, while maintaining the redundancy introduced by the inner codes at a lower level as compared to a conventional GCC, thereby maintaining a high code rate. Thus, the GCC encoding along with the outer-layer coding may achieve a desired tradeoff between encoding and decoding performance, error correction power, and/or redundancy management. The improved encoding and decoding methods of the present invention, in various embodiments, may be utilized in various applications, including but not limited to, transmission over a wireless or wired channel, storage in a memory device (e.g., flash memory device), etc.

Figure 12:
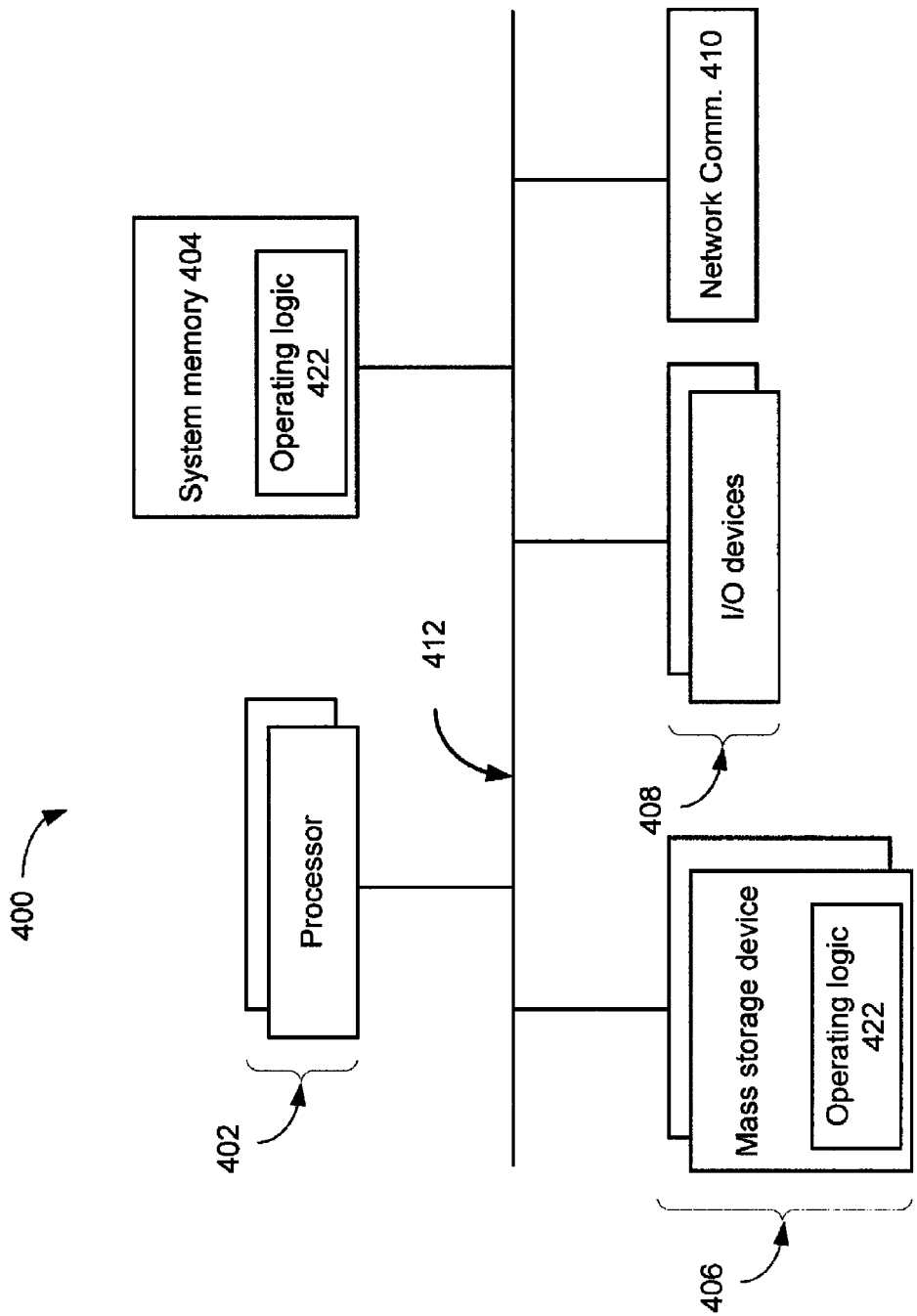
FIG. 12 illustrates a block diagram of an example computer system suitable for use to practice the present invention, in accordance with various embodiments.

FIG. 12 illustrates a block diagram of an example system suitable for use to practice the present invention, in accordance with various embodiments. As illustrated, system 400 includes one or more processors or processor cores 402, and system memory 404. For the purpose of this application, including the claims, the terms "processor" and "processor cores" may be considered synonymous, unless the context clearly requires otherwise. Additionally, system 400 includes mass storage devices 406 (such as diskette, hard drive, compact disc read only memory (CDROM) and so forth), input/output devices 408 (such as a display to render visual manifestation 100, a keyboard, a cursor control, and so forth) and communication interfaces 410 (such as network interface cards, modems and so forth). The elements are coupled to each other via system bus 412, which represents one or more buses. In the case of multiple buses, they are bridged by one or more bus bridges (not illustrated).

Each of these elements performs its conventional functions known in the art. In particular, system memory 404 and mass storage 406 may be employed to store a working copy and a permanent copy of the programming instructions implementing all or a portion of earlier described functions, herein collectively denoted as 422. The instructions 422 may be assembler instructions supported by processor(s) 402 or instructions that can be compiled from high level languages, such as C.

The permanent copy of the programming instructions may be placed into permanent storage 406 in the factory, or in the field, through, for example, a distribution medium (not shown), such as a compact disc (CD), or through communication interface 410 (from a distribution server (not shown)). That is, one or more distribution media having instructions 422 may be employed to distribute the instructions 422 and program various computing devices.

The constitution of these elements 402-412 are generally well known, and accordingly will not be further described.

In embodiments of the present invention, an article of manufacture (not illustrated) may be employed to implement one or more methods as disclosed herein. For example, in exemplary embodiments, an article of manufacture may comprise a storage medium and a plurality of programming instructions stored in the storage medium and adapted to program computing device to configure the computing device to enable receiving data, encoding the received data to obtain first encoded data, encoding the first encoded data until a generalized concatenation code (GCC) encoding reaches an intermediate level; and terminating the encoding of the first encoded data at the intermediate level of the GCC encoding to provide GCC encoded data.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present invention. This disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware. This application is intended to cover any adaptations or variations of the embodiment discussed herein. Therefore, it is manifested and intended that the invention be limited only by the claims and the equivalents thereof.

What is claimed is:

1. A method comprising:
   receiving data;
   encoding the received data to obtain first encoded data;
   segmenting the first encoded data into a plurality of segments;
   generalized concatenation code (GCC) encoding the first encoded data until the GCC encoding reaches an intermediate level; and
   terminating the GCC encoding of the first encoded data at the intermediate level of the GCC encoding;
   wherein said GCC encoding the first encoded data comprises separately GCC encoding each of the plurality of segments of the first encoded data to obtain a plurality of GCC encoded data.

2. The method of claim 1, wherein said terminating further comprises:
   terminating the GCC encoding at the intermediate level of the GCC encoding such that each of a plurality of co-sets of the intermediate level includes multiple code words.

3. The method of claim 2, wherein said GCC encoding the first encoded data further comprises:
   forming a plurality of outer codes and a plurality of inner codes.

4. The method of claim 1, wherein said GCC encoding the first encoded data further comprises:
   repeatedly partitioning an inner code until reaching the intermediate level.

5. The method of claim 1, wherein said terminating further comprises:
   terminating the GCC encoding of the first encoded data at the intermediate level such that a hamming distance of an inner code of the intermediate level is finite.

6. The method of claim 1, wherein separately GCC encoding each of the plurality of segments of the first encoded data using the GCC encoding comprises GCC encoding in parallel.

7. The method of claim 1, wherein separately GCC encoding each of the plurality of segments of the first encoded data using the GCC encoding comprises GCC encoding serially.

8. The method of claim 1, further comprising:
   multiplexing the plurality of GCC encoded data; and
   transmitting the multiplexed plurality of GCC encoded data.

9. The method of claim 1, wherein said encoding the received data further comprises:
   encoding the received data using an algebraic code.

10. The method of claim 1, wherein said encoding the received data further comprises:
    encoding the received data using a Reed-Solomon (RS) code or a Bose-Chaudhuri-Hocquenghem (BCH) code.

11. The method of claim 1, further comprising:
    storing the plurality of GCC encoded data in a flash memory device.

12. The method of claim 1, further comprising:
    transmitting the plurality of GCC encoded data.

13. The method of claim 12, further comprising:
    receiving the transmitted plurality of GCC encoded data;
    decoding the transmitted plurality of GCC encoded data to generate a first decoded data; and
    decoding the first decoded data using an outer-layer code.

14. An apparatus comprising:
    an outer-layer code encoder configured to receive data and encode the received data into first encoded data;

a segmenter configured to segment the first encoded data into a plurality of segments; and at least one generalized concatenation code (GCC) encoder configured to separately GCC encode each of the plurality of segments of the first encoded data, and terminate the GCC encoding at an intermediate level to provide GCC encoded data.

15. The apparatus of claim 14, wherein the GCC encoder is further configured to terminate the GCC encoding at the intermediate level such that each of a plurality of co-sets of the intermediate level includes multiple code words.

16. The apparatus of claim 14, wherein the GCC encoder is configured to repeatedly partition an inner code until reaching the intermediate level.

17. The apparatus of claim 14, further comprising:

a plurality of GCC encoders, each GCC encoder configured to GCC encode a respective segment of the first encoded data.

18. The apparatus of claim 17, further comprising:

a multiplexer configured to receive and multiplex outputs from the plurality of GCC encoders.

19. The apparatus of claim 14, further comprising:

at least one GCC decoder configured to decode the output of the at least one GCC encoder; and an outer-layer code decoder configured to decode the output of the at least one GCC decoder.

20. The apparatus of claim 14, wherein the outer-layer code encoder is a Reed-Solomon (RS) encoder or a Bose-Chaudhuri-Hocquenghem (BCH) encoder.

21. An apparatus comprising:

means for receiving data;

means for encoding the received data to obtain first encoded data;

means for segmenting the first encoded data into a plurality of segments means for generalized concatenation code (GCC) encoding the first encoded data until the GCC encoding reaches an intermediate level; and means for terminating the GCC encoding at the intermediate level;

wherein said means for encoding the first encoded data is configured to separately GCC encode each of the plurality of segments of the first encoded data to obtain a plurality of GCC encoded data.

22. The apparatus of claim 21, wherein the GCC encoding is terminated at the intermediate level such that each of a plurality of co-sets of the intermediate level includes multiple code words.

23. The apparatus of claim 21, wherein said means for GCC encoding the first encoded data further comprises:

means for forming a plurality of outer codes and a plurality of inner codes.

* * * * *